United States Patent [19]
Hurtig, III
[11] 3,720,881
[45] March 13, 1973

[54] FILTER NETWORK HAVING NEGATIVE FEEDBACK LOOPS

[75] Inventor: Gunnar Hurtig, III, Santa Clara, Calif.
[73] Assignee: Kinetic Technology, Inc., Santa Clara, Calif.

[22] Filed: Jan. 17, 1972
[21] Appl. No.: 218,162

[52] U.S. Cl. ....................330/107, 330/109
[51] Int. Cl. ....................H03f 1/36
[58] Field of Search ....................330/21, 31, 107, 109

[56] References Cited

OTHER PUBLICATIONS

Moschutz et al.; "Active Filters: Part 5 Applying The Operational Amplifier", Electronics Dec. 9, 1968, pp. 98–106

*Primary Examiner*—Roy Lake
*Assistant Examiner*—James B. Mullins
*Attorney*—Roger S. Borovoy

[57] ABSTRACT

A filter network having an input terminal and an output terminal and a plurality of cascaded filter sections, each section having a designated frequency response, the bandpass or lowpass characteristics of each section being calculated by a formula, and including a plurality of negative feedback loops, one for each filter section except the first, each loop being coupled between the output terminal of the respective filter section and the input terminal of the filter network through a summing means, the gain of each feedback loop being calculated by a formula.

16 Claims, 4 Drawing Figures

FILTER NETWORK HAVING NEGATIVE FEEDBACK LOOPS

BACKGROUND OF THE INVENTION

1. Field of the Invention

This invention is in the field of filter networks, particularly networks made up of a plurality of filter sections, preferably active filter sections to achieve lowpass-to-bandpass or lowpass-to-lowpass conversion of an input a-c signal.

2. Prior Art

In the design of active filter networks, there are two approaches for achieving a filter network with a particular frequency response characteristic. The first is the direct realization approach, where a specific filter transfer function is synthesized as a two terminal device, much in the same way as with the construction of passive filters. The second approach, becoming increasingly more popular, is to construct a filter having a particular frequency response using cascaded filter sections. Such a filter is constructed by the connection of filter sections with proper isolation between the sections, each section providing a first order or a second order transfer function. These prior art cascading techniques are described in the book "Active Inductorless Filters," edited by Sanjit K. Mitra, IEEE Press, 1971, pages 1-4.

In using the prior art cascading approaches, it is necessary for the designer to calculate the center frequency $\omega_o$ and the quality factor Q of each filter section. In order to achieve the desired frequency characteristics of the combined, cascaded filter network, in most instances it is necessary to make each filter section different from the others in order to achieve the proper overall parameters of the combined unit. These prior art techniques used no feedback circuits. As a consequence, small errors in the design or construction of each filter section generally produce a large error in the final result. Accordingly, both the design and the construction of such cascaded filters is an iterative, empirical, time-consuming process. The resulting designs require corrective networks to compensate for the errors in each section. These prior art design techniques are also described in Mitra, cited above, particularly pages 167-168.

SUMMARY OF THE INVENTION

This invention overcomes the above design disadvantages of the prior art cascaded filter networks. Using the techniques to be set forth herein, each filter section of the cascaded filter network is identical with every other filter section. This makes construction much simpler and mass production a reality as one can inventory the identical sections in the quantities required of each section. In the prior art, in most instances many different types of individual sections are required, preventing inventorying product and making each job a custom one.

One embodiment of the invention is a lowpass-to-bandpass filter network comprising an input terminal and an output terminal, the input terminal being coupled to the input terminal of a summing means, the summing means itself having a plurality of input terminals; a plurality of cascaded filter sections, each section exhibiting a bandpass frequency response and having an input terminal, an output terminal, a quality factor $Q$, and a center frequency $\omega_o$ which is the overall center frequency of the desired filter network, the center frequencies of each section being the same and the $Q$ of each section being the same and equal to $nQ_o/A_{n-1}$, where $Q_o$ is the overall quality factor of the filter network and equals $\omega_o/bw$, where bw is the overall bandwidth of the filter network, n is the number of sections, and $A_{n-1}$ are the coefficients of the denominators of the lowpass prototype response function taken from a tabulation of lowpass response functions. The input terminal of the first filter section is coupled to the output terminal of the summing means, and the output terminal of the last filter section is coupled to the output terminal of the network. A plurality of feedback loops are employed, one for each filter section except the first, each loop coupled between the output terminal of its respective filter section and an input terminal of the summing means, the gain of each feedback loop being $F_k$ where $k$ is the number in numerical sequence of the respective filter section, $k$ always being greater than one, and where $F_k$ is calculated by solving $n-1$ simultaneous equations $$\sum_{k=0}^{k=j} \frac{(n-k)!}{(j-k)!(n-j)!} \cdot F_k = \frac{A_{n-j} \cdot n^j}{A_{n-1}^j}$$

wherein $j$ is an integer from 2 to $n$, $F_0 = 1$, and $F_1 = 0$.

Another embodiment of the invention is a lowpass-to-lowpass filter network comprising an input terminal and an output terminal, the input terminal being coupled to the input terminal of a summing means, the summing means itself having a plurality of input terminals; a plurality of n cascaded filter sections, n being an integer greater than one, each section having an input terminal, an output terminal, and a first order lowpass subsection having a frequency $\omega$, the frequency of the corresponding subsections of each filter section being the same and equal to $(A_{n-1}/n)\ \omega_c$, where $A_{n-1}$ are the coefficients of the denominators of the desired lowpass prototype response function taken from a tabulation of standard lowpass response functions, and where $\omega_c$ is the desired cutoff frequency of the filter network. The input terminal of the first filter section is coupled to the output terminal of the summing means, and the output terminal of the last filter section is coupled to the output terminal of the filter network. A plurality of negative feedback loops are employed, one for each filter section except the first, each loop being coupled between the output terminal of its respective filter section and an input terminal of the summing means. The gain of each feedback loop is $F_k$ where $k$ is the number in numerical sequence of the respective filter section, $k$ always being greater than one, and where $F_k$ is calculated by solving $n-1$ simultaneous equations given by the series:

$$\sum_{k=0}^{k=j} \frac{(n-k)!}{(j-k)!(n-j)!} \cdot F_k = \frac{A_{n-j} \cdot n^j}{A_{n-1}^j}$$

wherein $j$ is an integer from 2 to $n$, $F_0 = 1$, and $F_1 = 0$.

In a preferred embodiment of the invention, each of the filter sections is an active filter section and each of the feedback loops is wholly resistive.

The filter networks of the invention, using repetitive sections, have been found to be extremely accurate and easy to mass produce.

DETAILED DESCRIPTION

Figure 1:
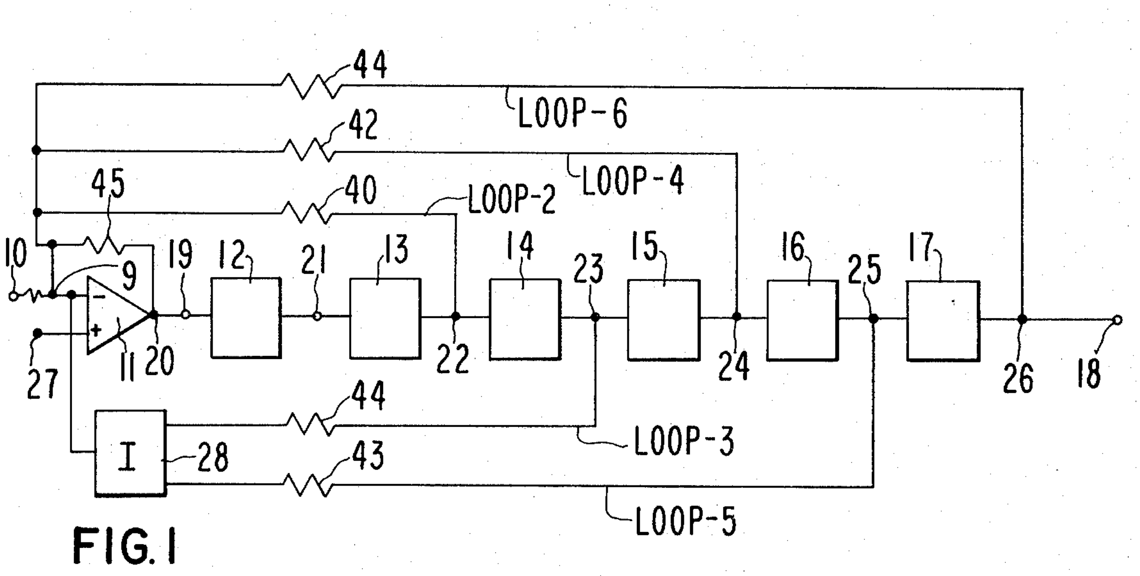
FIG. 1 is a block and schematic diagram of a preferred embodiment of a lowpass-to-bandpass filter network of the invention.

Referring now to the drawings, particularly to FIG. 1, a preferred embodiment of the lowpass-to-bandpass filter of the invention is shown. The filter network has an input terminal 10 coupled to an input terminal 9 of summing amplifier 11. The output terminal 20 of summing amplifier 11 is coupled to the input terminal 19 of the first filter section 12 of the lowpass-to-bandpass filter network. Such a network must have at least two filter sections. The network in FIG. 1 has six filter sections, 12, 13, 14, 15, 16 and 17. These sections are series-coupled, as shown. Terminal 21 is the output terminal of filter section 12 and the input terminal of section 13. Terminal 22 is the output terminal of section 13 and the input terminal of section 14. Terminal 23 is the output terminal of section 14 and the input terminal of section 15. Terminal 24 is the output terminal of section 15 and the input terminal of section 16. Terminal 25 is the output terminal of section 16 and the input terminal of section 17. Finally, terminal 26 is the output terminal of section 17, and is coupled to terminal 18 which is the output terminal of the entire filter network shown in FIG. 1.

Figure 2:
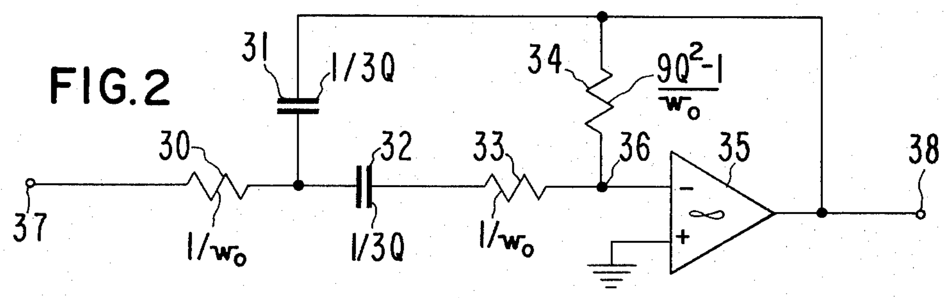
FIG. 2 is a block and schematic diagram of a preferred embodiment of a filter section of the filter network of FIG. 1.

A typical filter section for the network of FIG. 1 is shown in FIG. 2. In accordance with the invention, this section is exactly the same for each of the six filter sections 12–17 of the network of FIG. 1. It must be understood that the section shown in FIG. 2 is merely representative of the many types of filter sections which can be employed in the invention. These filter sections are sometimes referred to in the art as "pole-pairs" and are so defined on page 31 of the Mitra book referenced earlier in this specification. According to Mitra, the two parameters which together define a "-pole-pair" or filter section are the $Q$ and the $\omega_o$. $Q$ is the quality factor of the filter section and is derived from the ratio $\omega_o$ to bandwidth of the network. $\omega_o$ is the center frequency of each of the filter sections, such as the one shown in FIG. 2. In this invention, it must also be the center frequency of all of the other filter sections 12–17 of the network of FIG. 1, and is equal to the overall frequency $\omega_o$ of the entire filter network. Each of the filter sections such as the one shown in FIG. 2, has an input terminal 37 and an output terminal 38.

The $Q$'s of each of the filter sections of this invention must also be the same. Each $Q$ of each section is equal to $nQ_o/A_{n-1}$, where $Q_o$ is the overall quality factor of the filter network and equals $\omega_o\ /bw$, where bw is the overall bandwidth of the filter network, n is the number of filter sections (six in the example shown in FIG. 1), and $A_{n-1}$ are the coefficients of the denominators of the desired lowpass prototype response function taken from a tabulation of lowpass response functions, expressed as $S^n + A_{n-1}S^{n-1} + \ldots + A_1S + A_0$. These lowpass response functions can be Butterworth, Chebychev, Bessel, or other standard lowpass prototype response functions. As an example, the Table below shows the coefficients for $n$'s between 1 and 10 for the Butterworth Polynomials.

TABLE

Coefficients of Butterworth Polynomials

| n | $A_1$ | $A_2$ | $A_3$ | $A_4$ | $A_5$ | $A_6$ | $A_7$ | $A_8$ | $A_9$ |
|---|---|---|---|---|---|---|---|---|---|
| 1 | | | | | | | | | |
| 2 | 1.4142136 | | | | | | | | |
| 3 | 2.0000000 | 2.0000000 | | | | | | | |
| 4 | 2.6131259 | 3.4142136 | 2.6131259 | | | | | | |
| 5 | 3.2360680 | 5.2360680 | 5.2360680 | 3.2360680 | | | | | |
| 6 | 3.8637033 | 7.4641016 | 9.1416202 | 7.4641016 | 3.8637033 | | | | |
| 7 | 4.4939592 | 10.0978347 | 14.5917939 | 14.5917939 | 10.0978347 | 4.4939592 | | | |
| 8 | 5.1258309 | 13.1370712 | 21.8461510 | 25.6883559 | 21.8461510 | 13.1370712 | 5.1258309 | | |
| 9 | 5.7587705 | 16.5817187 | 31.1634375 | 41.9863857 | 41.9863857 | 31.1634375 | 16.5817187 | 5.7587705 | |
| 10 | 6.39244532 | 20.4317294 | 42.8020611 | 64.8823963 | 74.2334292 | 64.8823963 | 42.8020611 | 20.4317291 | 6.3924532 |

In the six-section network shown in FIG 1, $n = 6$ and $n-1 = 5$. Looking in the above Table, the coefficient of the denominator of the Butterworth Polynomial $A_n$ when $n = 6$ ($A_{n-1}$ is $A_5$) is 3.8637033. It is then necessary to divide $6A_o$ (where $Q_o$ is the desired overall quality factor of the filter network) by 3.8637033 to obtain the $Q$, or the identical quality factor of each section of the filter network to be constructed. $Q_o$ of the network is obtained by dividing the bandwidth of the overall filter network into $\omega_o$, the center frequency of the overall filter network.

Referring to FIG. 2, having calculated the required $Q$ and $\omega_o$ for each of the filter sections 12–17 shown in FIG. 1, it is a simple matter to calculate the values for the discrete components of the exemplary filter section of FIG. 2. Since each of these six sections 12–17 is identical, mass production of the components and the circuits is possible. For example, resistors 30 and 33 have the value of $1/\omega_o$; capacitors 31 and 32 have the value of $1/3Q$; and resistor 34 has a value of $(9Q^2\text{-}1/\omega_o$. Amplifier 35 is a conventional, infinity-gain operational amplifier having its negative input terminal coupled to the junction 36 of resistors 33 and 34, and its positive input terminal grounded, as shown. Terminal 37 is the input terminal of the section, and terminal 38 is the output terminal.

The filter section shown in FIG. 2, of course, is merely representative. Other similar types of filter sections, also operative in the invention, but certainly far from an exhaustive list of the kinds of filter sections which will work, are described in the Mitra book named above, pages 31–41, particularly the figures on pages 40–41. Although active filters are preferred, passive filters will also work. The only requirements for the filter sections are that the $Q$ of each section be the same and equal $nQ_o/A_{n-1}$, and the center frequency be equal to $\omega_0$, the overall center frequency of the desired network. Preferably each filter section, such as the section of FIG. 2, has a high input impedance and a low output impedance, thus minimizing the interaction of their behavior.

Referring again to FIG. 1, the filter network of the invention requires a plurality of negative feedback loops, one for each filter section except the first. These loops are identified in FIG. 1 as loop-2, loop-3, loop-4, loop-5, and loop-6. Loop-2 is coupled between one input terminal 9 of summing amplifier 11 and the output terminal 22 of the second filter section 13. Loop-3 is coupled between the output terminal 23 of the third filter section 14, through inverter 28, to the input terminal 9 of summing amplifier 11. Loop-4 is coupled between input terminal 9 of the summing amplifier and the output terminal 24 of the fourth filter section 15. Loop-5 is coupled through inverter 28 between the output terminal 25 of filter section 16 and input terminal 9. Finally, loop-6 is coupled between the output terminal 26 of the last filter section 17 and input terminal 9.

It is essential that each of the feedback loops be negative. Since each filter section has negative gain, and thus acts as an inverter (as does summing amplifier 11), there must be an odd number of inverting blocks, including the amplifier and all intervening filter sections, between the output terminal of the appropriate filter section to which the feedback loop is connected, around the feedback loop, through any inverter, if applicable, summing amplifier, all intervening filter sections, back to the same output terminal of the appropriate filter section. For example, taking the feedback loop-3 connected to terminal 23, the first inversion takes place in inverter 28. Assuming that the signal at output terminal 23 is negative, after passing through inverter 28, the signal becomes positive; then passing through summing amplifier 11, the signal again becomes negative; the signal at the output terminal 21 of filter section 12 is positive; at the output terminal 22 of filter section 13 it is again negative; and finally, at the output terminal 23 of section 14, where the calculation was started, the output signal is finally positive. Since this signal at terminal 23 was assumed to be negative at the start, and after going around the feedback loop-3 it became positive, by definition, loop-3 is a negative feedback loop. The calculation of polarity around any of the other loops similarly results in each loop providing negative feedback.

Next, it is necessary to calculate the impedance values for each of the feedback loops. In the preferred embodiment of the invention shown in FIG. 1, each of the feedback loops is wholly resistive. Loop-2 contains resistor 40; loop-3 contains resistor 41; loop-4 contains resistor 42; loop-5 contains resistor 43; and loop-6 contains resistor 44. The loop gain of each feedback loop is designated $F_k$, where k is the number in numerical sequence of the respective filter section, $k$ always being greater than one. For example, the gain of loop-2, containing resistor 40, is $F_2$; the gain of loop-3 is $F_3$; the gain of loop-4 is $F_4$; the gain of loop-5 is $F_5$; and the gain of loop-6 is $F_6$. $F_k$ is calculated by solving $n-1$ simultaneous equations given by the series:

$$\sum_{k=0}^{k=j} \frac{(n-k)!}{(j-k)!(n-j)!} \cdot F_k = \frac{A_{n-j} \cdot n^j}{A_{n-1}^j}$$

wherein $j$ is an integer from 2 to $n$, $F_o = 1$, and $F_1 = 0$.

In the example of FIG. 1, $n = 6$ (there are six filter sections). The first equation to be generated is for $k = 0$, $j = 2$. The coefficient of $F_k$ on the left side of the equation (for $k = 0$, $F_k = F_o$) is $[(n-k)!/(j-k)!\ (n-j)!]$. For $k = o$, $j = 2$, the coefficient of $F_o$ is 15.

For $k = 1$, $j = 2$, the coefficient of $F_1$ need not be calculated, since by definition, $F_1 = 0$. For $k = 2$, $j = 2_1[(n-k)!/(j-k)!\ (n-k)!] = 4!/(0!4!) = 1$; thus the coefficient of $F_2 = 1$. Summing the left side of the equation for $k = 0$, k $= 1$, and $k = 2$, the result is:

$$15\, F_{o\,o}\ 0 + \mathbf{F}_2.$$

Calculating the right side of the equation for $n = 6$, $j = 2$:

$$A_{n-j} n^j / A_{n-1}{}^j = A_4 \cdot 6^2/(A_5)^2 = 36 A_4/(A_5)^2 = 18$$ (From the above Table, $A_4 = 7.4641016$, $A_5 = 3.8637033$.)

Therefore, to calculate $F_2$:

$$F_2 + \mathbf{15}\, F_o = 18.$$

By definition, $F_o = 1$; therefore $F_2 = 3$.

If the same calculation is made for $F_3$, a formula will be derived expressing $F_3$ as a function of certain constants and $F_2$. Since $F_2$ has already been calculated, as set forth above, to have a value of 3, such value can be substituted in the equation for $F_3$, and the value of $F_3$ may be directly calculated in the same manner as for $F_2$, above. Similarly, once $F_3$ has a finite value, the values for $F_4$ can be calculated, then $F_5$, and then $F_6$, in that order, to provide the gains of all five feedback loops shown in FIG. 1.

Now that the gains of each of the loops have been calculated, it is a simple matter, in the preferred embodiment where the feedback loops are wholly resistive, to calculate the value of the necessary feedback resistors 40, 41, 42, 43, and 44 in the network of FIG. 1. First, we can arbitrarily assign a value to the resistor 45 which couples the input terminal 10 of the network to the output terminal 20 of summing amplifier 11. Assuming resistor 45 has a resistive value of $R$ ohms, then the resistor 40 in feedback loop-2 has a value of $R/F_2$. Resistor 41 has a value of $R/F_3$; resistor 42 has a value of $R/F_4$; resistor 43 has a value of $R/F_5$; and resistor 44 has a value of $R/F_6$. The values of $F_2$ through $F_6$ were calculated as described above. In one example of the invention, resistor 45 may have a value of unity. In that case, each of the resistors of the respective feedback loops has a value of $1/F_n$, where n is the number of the particular feedback loop.

Figure 3:
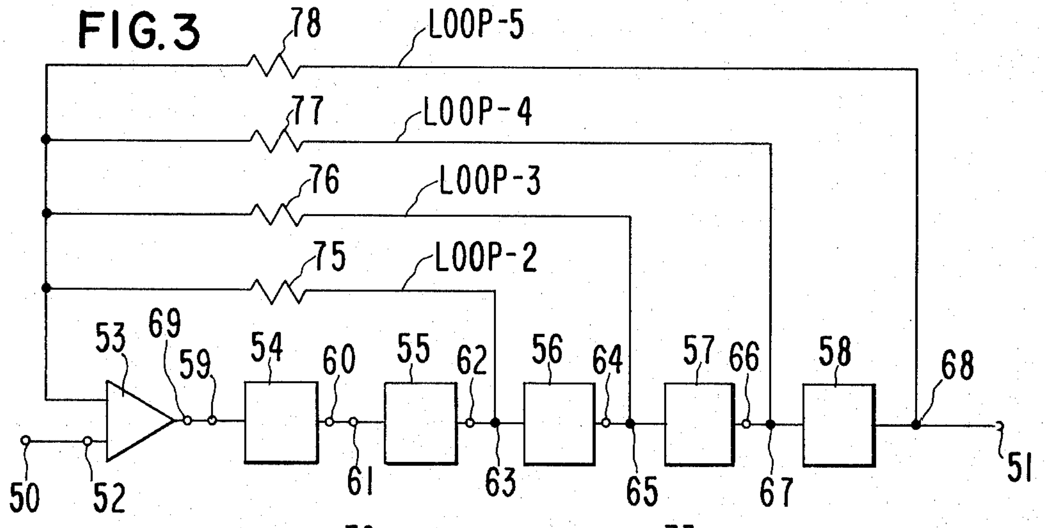
FIG. 3 is a block and schematic diagram of a preferred embodiment of a lowpass-to-lowpass filter network of the invention.

Referring to FIG. 3, a preferred embodiment of a lowpass-to-lowpass filter network of the invention is shown. There are normally n cascaded filter sections, $n$ always being an integer greater than one. In the embodiment shown in FIG. 3, n is equal to 5. This filter network has an input terminal 50 and an output terminal 51. Input terminal 50 has coupled to it an input terminal 52 of summing means 53. The network has five cascaded filter sections numbered 54, 55, 56, 57, and 58, respectively. Each section has an input terminal and an output terminal. Section 54, for example, has input terminal 59 and output terminal 60. Section 55 has input terminal 61 and output terminal 62; section 56 has input terminal 63 and output terminal 64; section 57 has input terminal 65 and output terminal 66; and section 58 has input terminal 67 and output terminal 68. The input terminal 59 of the first filter section 54 is coupled to the output terminal 69 of summing means 53. The output terminal 68 of the last section 58 is coupled to the output terminal 51 of the filter network.

Figure 4:
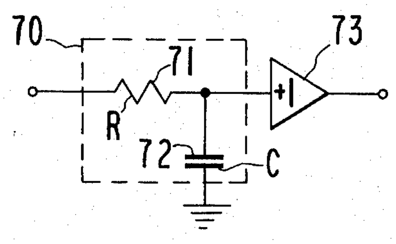
FIG. 4 is a block and schematic diagram of a preferred embodiment of a filter section of the filter network of FIG. 3.

An example of each of sections 54–58 for one embodiment of the filter network of FIG. 3 is shown in FIG. 4. Such a representative section has a first order lowpass subsection 70 including resistor 71 and capacitor 72. Such a subsection has a frequency $\omega$. The frequencies $\omega$ of the corresponding subsections 70 of each of filter sections 54–58 are the same, and equal to $A_{n-1}an)\cdot\ \omega_c$, where $A_{n-1}$ are the coefficients of the denominators of the desired lowpass prototype response function taken from a table of standard lowpass response functions (for example, the Table set forth above), and where $\omega_c$ is the desired overall frequency of the filter network shown in FIG. 3.

In accordance with the invention, the embodiment shown in FIG. 3 has a plurality of negative feedback loops 2–5, preferably wholly resistive. Loop-2 includes resistor 75; loop-3 includes resistor 76; loop-4 includes resistor 77; and loop-5 includes resistor 78. There is one feedback loop for each filter section except the first section 54, as shown. Each of these loops is designed to provide negative feedback, as discussed above, and the loop has a gain of $F_k$ where k is the number in numerical sequence of the respective filter section, $k$ always being greater than one. The value of the gain $F_k$ is calculated by solving $n-1$ simultaneous equations in exactly the same manner as discussed in detail above in connection with the lowpass-to-bandpass filter network of FIG. 1. It is therefore not deemed necessary to repeat the detailed description of the calculation of the loop gains.

Referring to FIG. 4, the preferred embodiment of a filter section of the invention has an isolation means 73, for example, a buffer amplifier, following each first order lowpass subsection 70. In the preferred embodiment of FIG. 4, buffer amplifier 73 is a unity gain amplifier, as illustrated. Isolated in this manner, one filter subsection will have little or no effect upon the next adjacent filter subsection. The response functions of each of the filter subsections may be any standard lowpass response functions taken from a standard table, such as Butterworth or Chebychev, discussed above. Preferably, each of the filter subsections will have a high input impedance and a low output impedance, selected to minimize the interaction of the behavior of one filter section on the next adjacent filter section.

The calculation of the particular resistor and capacitor values for the resistor 71 and capacitor 72 of FIG. 4 is arbitrary. The only parameter which matters is the ratio of the two values, as follows: $1/RC$ x G, $\omega$ being the frequency of the first order lowpass subsection 70 as well as the overall frequency of the network of FIG. 3.

I claim:

1. A lowpass-to-bandpass filter network comprising:

a. an input terminal and an output terminal, said input terminal being coupled to an input terminal of a summing means, said summing means having a plurality of input terminals;

b. a plurality of cascaded filter sections, each section exhibiting a bandpass frequency response and having an input terminal, an output terminal, a quality factor $Q$, and a center frequency $\omega_o$ which is the overall center frequency of said filter network, the center frequencies of each section being the same and the $Q$ of each section being the same and equal to $nQ_o/A_{n-1}$, where $Q_o$ is the overall quality factor of said filter network and equals $\omega_o/bw$ where bw is the overall bandwidth of said filter network, n is the number of sections, and $A_{n-1}$ are the coefficients of the denominators of the lowpass prototype response function taken from a tabulation of lowpass response functions, the input terminal of the first filter section being coupled to the output terminal of said summing means, and the output terminal of the last filter section being coupled to said output terminal of said network; and c. a plurality of negative feedback loops, one for each filter section except the first, each loop coupled between the output terminal of its respective filter section and an input terminal of said summing means, the gain of each feedback loop being $F_k$ where $k$ is the number in numerical sequence of the said respective filter section, $k$ always being greater than one, and where $F_k$ is calculated by solving $n-1$ simultaneous equations given by the series:

$$\sum_{k=0}^{k=j}\left[\frac{(n-k)!}{(j-k)!(n-j)!}\cdot F_k\right]=\frac{A_{n-j}\cdot n^j}{A_{n-1}^j}$$

wherein $j$ is an integer from 2 to $n$, $F_o=1$, and $F_1=0$.

2. The filter network of claim 1 further characterized by said denominators of the lowpass response functions being expressed in the form $S^n+A_{n-1}S^{n-1}\ldots A_1\,S+A_0$.

3. The filter network of claim 1 further characterized by said tabulation of standard lowpass response functions being a table of Chebychev or Butterworth Polynomials.

4. The filter network of claim 1 further characterized by the gain of each of said feedback loops $F_k$ being positive.

5. The filter network of claim 1 further characterized by each filter section having a high input impedance and a low output impedance, the impedances selected to minimize the interaction of the behavior of one filter section on the next adjacent filter section.

6. The filter network of claim 1 further characterized by each of said feedback loops being wholly resistive.

7. The filter network of claim 1 further characterized by each of said filter sections being an active filter.

8. A lowpass-to-lowpass filter network comprising:

a. an input terminal and an output terminal, said input terminal being coupled to the input terminal of a summing means, said summing means having a plurality of input terminals;

b. a plurality of $n$ cascaded filter sections, $n$ being an integer greater than 1, each section having an input terminal, an output terminal, and a first order lowpass subsection having a frequency $\omega$, the frequency of the corresponding subsections of each filter section being the same and equal to $(A_{n-1}/n)\ \omega_c$, where $A_1$ are the coefficients of the denominators of the lowpass prototype response function taken from a tabulation of lowpass response functions, and where $\omega_c$ is the desired frequency of said filter network, the input terminal of the first filter section being coupled to the output terminal of said summing means, and the output terminal of the last filter section being coupled to said output terminal of said filter network; and c. a plurality of negative feedback loops, one for each filter section except the first, each loop coupled between the output terminal of its respective filter section and an input of said summing means, the gain of each feedback loop being $F_k$ where $k$ is the number in numerical sequence of said respective filter section, $k$ always being greater than one, and where $F_k$ is calculated by solving $n-1$ simultaneous equations given by the series:

$$\sum_{k=0}^{k=j}\left[\frac{(n-k)!}{(j-k)!(n-j)!}\cdot F_k\right]=\frac{A_{n-j}\cdot n^j}{A^j_{n-1}}$$

wherein $j$ is an integer from 2 to $n$, $F_0=1$, and $F_1=0$.

9. The filter network of claim 8 further characterized by the addition, after each filter section, of an isolation means for isolating said filter section from the next adjacent filter section.

10. The filter network of claim 9 further characterized by said isolations means being a buffer amplifier.

11. The filter network of claim 8 further characterized by said denominators of the lowpass response functions being expressed in the form $S^n + A_{n-1}\ S^{n-1}\ldots A_1\ S+A_0$.

12. The filter network of claim 8 further characterized by said tabulation of standard lowpass response functions being a table of Chebychev or Butterworth Polynomials.

13. The filter network of claim 8 further characterized by the gain of each of said feedback loops $F_k$ being positive.

14. The filter network of claim 8 further characterized by each filter section having a high input impedance and a low output impedance, the impedances selected to minimize the interaction of the behavior of one filter section on the next adjacent filter section.

15. The filter network of claim 8 further characterized by each of said feedback loops being wholly resistive.

16. The filter network of claim 8 further characterized by each of said filter sections being an active filter.

* * * * *